United States Patent [19]

Nakata et al.

[11] Patent Number: 5,355,081
[45] Date of Patent: Oct. 11, 1994

[54] METHOD FOR TESTING A SEMICONDUCTOR INTEGRATED CIRCUIT HAVING SELF TESTING CIRCUIT

[75] Inventors: Yoshiro Nakata, Ikoma; Atsushi Fujiwara, Kadoma; Akinori Shibayama, Neyagawa, all of Japan

[73] Assignee: Matsushita Electric Industrial Co., Ltd., Osaka, Japan

[21] Appl. No.: 65,123

[22] Filed: May 20, 1993

Related U.S. Application Data

[62] Division of Ser. No. 767,998, Sep. 30, 1991, Pat. No. 5,248,936.

[30] Foreign Application Priority Data

Oct. 1, 1990 [JP] Japan .................................. 2-264003

[51] Int. Cl.$^5$ ........................................... G01R 15/12
[52] U.S. Cl. ..................... 324/765; 324/73.1
[58] Field of Search .............. 324/158 R, 73.1; 371/15.1, 25.1, 22.1, 22.5, 22.6; 307/303.1; 340/653; 358/101, 106; 437/8

[56] References Cited

U.S. PATENT DOCUMENTS

| | | | |
|---|---|---|---|
| 4,970,454 | 11/1990 | Stambaugh et al. | 324/73.1 |
| 4,978,908 | 12/1990 | Mahant-Shetti et al. | 324/73.1 |
| 5,097,206 | 3/1992 | Perner | 324/158 R |
| 5,130,645 | 7/1992 | Levy | 324/158 R |
| 5,153,503 | 10/1992 | Yahata | 324/158 D |
| 5,159,262 | 10/1992 | Rumbaugh et al. | 324/158 D |

FOREIGN PATENT DOCUMENTS 2527859  3/1977  Fed. Rep. of Germany .

OTHER PUBLICATIONS

T. Takeshima et al., "A 55-ns 16 Mb DRAM with Built-in Self-Test Function Using Microprogram ROM", IEEE Journal of Solid-State Circuits, vol. 25, No. 4, pp. 903–909 (Aug. 1990).

T. Takeshima et al., "A 55ns 16 Mb DRAM", from ISSCC Digest of Technical Papers, at pp. 246–247 (1989).

"2.3 Built-In Test", from Built-In Test for VLSI, Wiley-Interscience, at pp. 38–43.

*Primary Examiner*—Vinh Nguyen
*Attorney, Agent, or Firm*—Ratner & Prestia

[57] ABSTRACT

A method is provided for testing a semiconductor integrated circuit including a main circuit, a self testing circuit for testing at least one part of the functions of the main circuit, and a test result output circuit having at least one light emitting device for outputting results from the self testing circuit in the form of light. The method includes the steps of inputting a test start to the self testing circuit so as to initiate operation of the self testing circuit; detecting light emitted from the light emitting device with an optical system, the light being emitted based on the test results from the self testing circuit; and obtaining the test results based on the light detection.

4 Claims, 6 Drawing Sheets

| | POWER SUPPLY | TE PIN | TR PIN | TOTAL |
|---|---|---|---|---|
| PRIOR ART | 256 | 128 | 128 | 512 |
| FIRST EMBODIMENT | 256 | 128 | 0 | 384 |
| SECOND EMBODIMENT | 256 | 0 | 0 | 256 |
| THIRD EMBODIMENT | 2 | 0 | 0 | 2 |

FIG. 10

METHOD FOR TESTING A SEMICONDUCTOR INTEGRATED CIRCUIT HAVING SELF TESTING CIRCUIT

This application is a continuation of application Ser. No. 07/767,998, filed Sep. 30, 1991, now U.S. Pat. No. 5,248,936.

BACKGROUND OF THE INVENTION

1. Field of the Invention

The present invention relates to a semiconductor integrated circuit with a built-in self testing circuit and a method of testing the same.

2. Description of the Prior Art

With increasing integration of random access memories (RAMs), microprocessor units (MPUs), etc., a longer time is needed to test the proper operation of memory cells and logic in the RAMs and the MPUs, resulting in an increase in the test cost involved. One approach to the resolution of this problem is a built-in self testing (BIST) technique which provides the device itself with a test function.

A prior art example of a semiconductor integrated circuit with a built-in self testing circuit is described in Technical Report No. ICD-39 published by the institute of Electronics, Information and Communication Engineers.

FIG. 8 is a block diagram showing the construction of a prior art example of a semiconductor integrated circuit with a built-in self testing circuit. The semiconductor integrated circuit comprises: a main circuit 1 having the intended functions as the semiconductor integrated circuit; a self testing circuit 2 for self testing the main circuit 1; and a test start signal detection circuit 3 that detects the initiation of a test mode by an electrical signal applied from an external terminal through a needle-tipped probe or the like to activate the self testing circuit 2.

In the prior art semiconductor integrated circuit of the above construction, when a prescribed electrical signal is applied from outside the semiconductor integrated circuit, the test start signal detection circuit 3 detects the application of the signal and transfers it as a self testing circuit activation signal 10 to the self testing circuit 2. In response, the self testing circuit 2 enters the test mode to initiate the testing of the main circuit 1. When the test is completed, the self testing circuit 2 electrically outputs a test complete signal 11, which indicates the completion of the test, and a test result signal 12, which indicates the test result, to an external circuit (not shown).

In the above prior art construction, in order to test a plurality of semiconductor integrated circuits formed on a single substrate (e.g., a silicon wafer) before cutting apart and fabricating them into separate chips, terminals through which the power supply voltage, the test start signal, the test complete signal, and the test result signal are transferred to each individual semiconductor integrated circuit must be electrically connected to an external test apparatus (e.g., a prober) by means of needle-tipped probes or other leads. These connections are automatically made using an apparatus called an auto prober, but since it is difficult to make connections to all the semiconductor integrated circuits on the same substrate at the same time, it is necessary to divide the substrate into a number of sections for testing even though a self testing circuit is incorporated in each individual semiconductor integrated circuit. As a result, in testing RAMs or MPUs which require wide-ranging, complex testing, the prior art has had the problem that the testing takes an enormous amount of time, and occupying expensive test instruments for an extended period of time.

For example, in the case of a six-inch wafer with a total of 128 semiconductor integrated circuits formed thereon, each measuring 10 mm×20 mm, as shown in FIG. 9, if all the semiconductor integrated circuits on the same substrate are to be tested at once by using their respective internal self testing circuits, a total of four probes will be necessary for testing each semiconductor integrated circuit, at least two for the power supply, one for the test start signal and one for the test result output signal, which means a total of 512 probes for the entire substrate. The number of probes further increases as the device size decreases. The number of probes that can be connected at the same time is at most 100 to 300, and it is therefore essential to minimize the number of probes if all the semiconductor integrated circuits on the same substrate are to be tested at the same time.

SUMMARY OF THE INVENTION

The semiconductor integrated circuit of this invention, which overcomes the above-discussed and numerous other disadvantages and deficiencies of the prior art, comprises a main circuit; a self testing circuit for testing at least one part of functions of said main circuit; and a test result output circuit having at least one light emitting device for outputting test results from said self testing circuit in the form of light.

In preferred embodiments, said light emitting device is integrated with said main circuit.

In another aspect of the invention, a semiconductor integrated circuit comprises: a main circuit; a self testing circuit for testing at least one part of functions of said main circuit; and a test start signal detection circuit having at least one light sensitive device for detecting a test start signal in the form of light, said test start signal detection circuit transferring said test start signal to said self testing circuit.

In preferred embodiments, said semiconductor integrated circuit further comprises a test result output circuit having at least one light emitting device for outputting test results from said self testing circuit in the form of light.

In a further aspect of the invention, a method of testing a plurality of semiconductor integrated circuits formed on a substrate is provided, each of said plurality of semiconductor integrated circuits comprising a main circuit, a self testing circuit for testing at least one part of functions of said main circuit, and a test result output circuit having at least one light emitting device for outputting test results from said self testing circuit in the form of light. The method comprises the steps of: forming at least one conductive wiring on scribe lines of said substrate, and forming at least one conductive pad connected with said conductive wiring on said substrate, said conductive wiring electrically interconnecting at least one part of at least two of said plurality of semiconductor integrated circuits to said conductive pad; and testing said plurality of semiconductor integrated circuits, with supplying prescribed voltages to said conductive wiring through said conductive pad.

In a still further aspect of the invention, a method of testing a semiconductor integrated circuit is provided, which comprises a main circuit, a self testing circuit for testing at least one part of functions of said main circuit, and a test result output circuit having at least one light emitting device for outputting test results from said self testing circuit in the form of light. The method comprises the steps of: inputting a test start signal to said self testing circuit; detecting light emitted from said light emitting device by a photomultiplier; and obtaining said test results from said self testing circuit.

In a still further aspect of the invention, a method of testing a plurality of semiconductor integrated circuits formed on a substrate is provided, each of said plurality of semiconductor integrated circuits comprising a main circuit, a self testing circuit for testing at least one part of functions of said main circuit, and a test result output circuit having at least one light emitting device for outputting test results from said self testing circuit in the form of light. The method comprises the steps of: detecting a two-dimensional distribution of light emitted from a plurality of said light emitting device by a photomultiplier having a multi-channel plate, said photomultiplier producing electric signals representative of a two-dimensional image of said two-dimensional distribution of said light; and obtaining a two-dimensional map of said test results by an image processing technique, based on said electric signals.

Thus, the invention described herein makes possible the objective of providing a semiconductor integrated circuit and a method of testing the same, wherein the number of electrical connections between a prober or the like and the semiconductor integrated circuit is reduced, and a drastic reduction in test time is accomplished.

BRIEF DESCRIPTION OF THE DRAWINGS

This invention may be better understood and its numerous objects and advantages will become apparent to those skilled in the art by reference to the accompanying drawings as follows:

FIG. 10 shows examples of the required number of probes in the prior art and the embodiments according to the invention.

DESCRIPTION OF THE PREFERRED EMBODIMENTS

Figure 1:
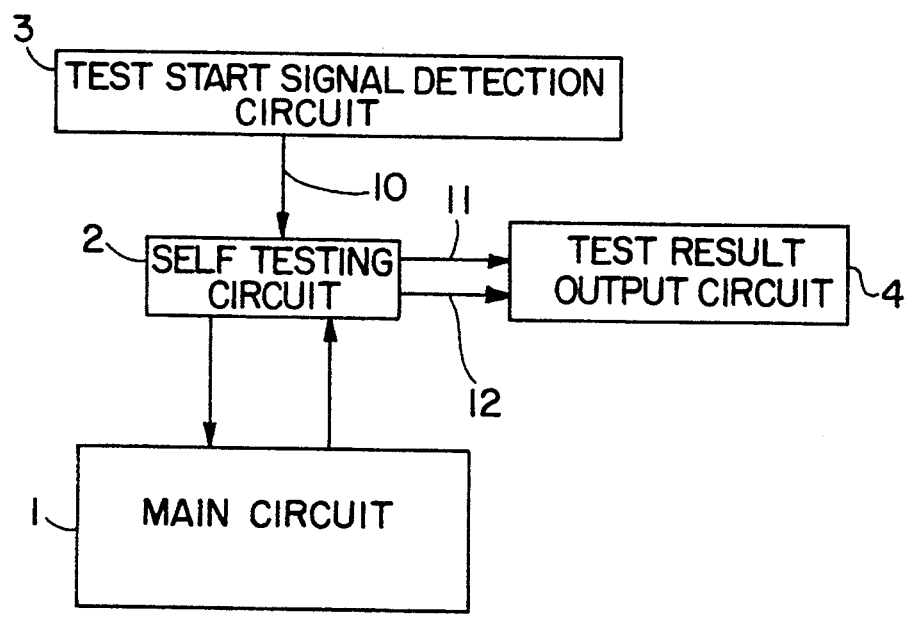
FIG. 1 is a block diagram showing construction of a first embodiment of a semiconductor integrated circuit according to the present invention.

FIG. 1 is a block diagram showing the construction of a first embodiment of a semiconductor integrated circuit according to the invention. The semiconductor integrated circuit comprises: a main circuit 1 having the intended functions as the semiconductor integrated circuit; a self testing circuit 2 for self testing the main circuit 1; a test start signal detection circuit 3 for activating the self testing circuit 2 by detecting an electrical signal applied from an external terminal instructing the initiation of a test mode; and a test result output circuit 4 containing a light emitting device 14 for converting a test complete signal indicating the completion of the test and a test result signal indicating the test result, both being supplied from the self testing circuit 2, into optical signals for outputting to an external device.

Figure 2:
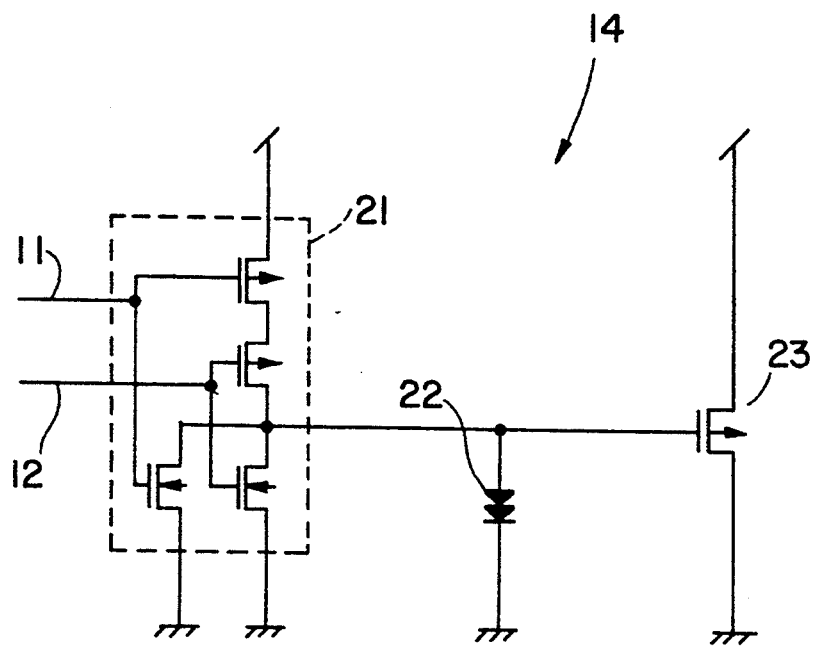
FIG. 2 shows a detailed circuit diagram of a light emitting device in the first embodiment.

FIG. 2 shows a detailed circuit diagram of the light emitting device 14 used in this embodiment. The light emitting device 14 comprises a NAND circuit 21 constructed with CMOSFETs, a voltage regulator circuit 22 realized by a p-n junction diode for generating a gate voltage suitable for light emission, and an n-channel MOSFET 23 for emitting light to an external device.

The following describes the operation of the thus constructed semiconductor integrated circuit of this embodiment. As previously described in connection with the prior art, when a prescribed electrical signal is applied from outside the semiconductor integrated circuit through a needle-tipped probe or the like, the input signal is detected by the test start signal detection circuit 3 which than transfers this signal as a self testing circuit activation signal 10 to the self testing circuit 2. In response, the self testing circuit 2 enters the test mode to initiate the testing of the main circuit 1. When the test is completed, the self testing circuit 2 outputs a test complete signal 11 indicating the completion of the test and a test result signal 12 indicating the test result. The light emitting device 14 receives and converts the test complete signal 11 and test result signal 12 into light for outputting to an external device.

An example of actual operation of the light emitting device 14 will now be described with reference to FIG. 2. When the test is completed (END=negative) and the test result is OK (ERROR=negative), the output of the NOR circuit 21 is positive (high). In response to this output, the diode 22 at the next stage outputs a gate voltage that can readily cause the light emitting MOSFET 23 to emit light. The light emission from the light emitting MOSFET 23 takes place when the channel current flowing through a strong electric field region at the drain junction gains energy by the electric field. The intensity of light produced is a function of the drain voltage, gate length, drain geometry, etc.

In this embodiment, a separate power supply is used to provide the gate voltage for the light emitting MOSFET so that a greater voltage than by a power supply used for the internal circuit is applied to the drain. Also, the drain geometry is of a single drain configuration (not having a graded junction) formed by doing a single implant of As ions into the drain region. As a result, the intensity of light emission is increased in the vicinity of the drain region so that an ordinary optical system can detect the light emission.

As described, according to the embodiment, since the light emitting device 14 is provided which outputs the test result of the self testing circuit 2 to an external device, the test result can be output to the outside of the semiconductor integrated circuit without having to provide electrical connections. As a result, there is no need to provide electrical connections, except for the test start signal wiring and power supply wiring, using a prober or the like which have previously prevented the simultaneous testing of semiconductor integrated circuits on the same substrate: the provision of the light emitting device 14 thus makes possible the simultaneous testing of a greater number of semiconductor integrated circuits as formed on the same wafer. Also, since the light emitting device 14 does not use any special device but is formed from a MOSFET that can be formed simultaneously with other devices in the usual process, no additional process step is needed for the formation of the light emitting device 14. Furthermore, by providing two or more such light emitting devices, it is possible to output not only a good/bad signal but also signals representing failure modes (such as input/output failure, operating speed failure, redundant repairability failure, etc.).

Figure 9:
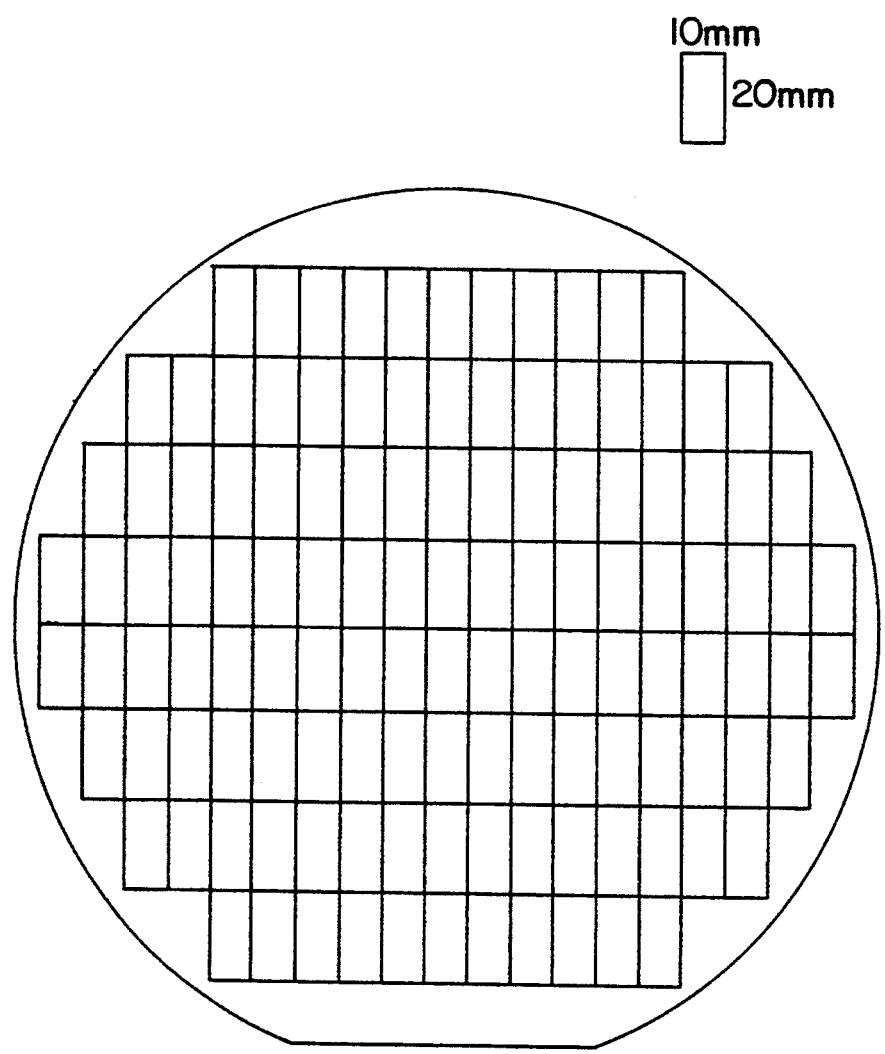
FIG. 9 shows a top plan view of a six-inch wafer with a total of 128 semiconductor integrated circuits formed thereon.

An example of the required number of probes in the present embodiment is shown in FIG. 10. This relates to the semiconductor integrated circuits simultaneously formed on the 6-inch wafer shown in FIG. 9, each IC chip measuring 10 mm×20 mm. As compared with the prior art example, since the test result output pins (TR) are rendered unnecessary, the required number of probes is reduced by 128.

In this embodiment, an n-channel MOSFET is used as the light emitting device 14, but alternatively, a p-n junction diode, a bipolar transistor, a thin oxide film used as a gate insulating film or a capacitor, etc. may be used.

Figure 3:
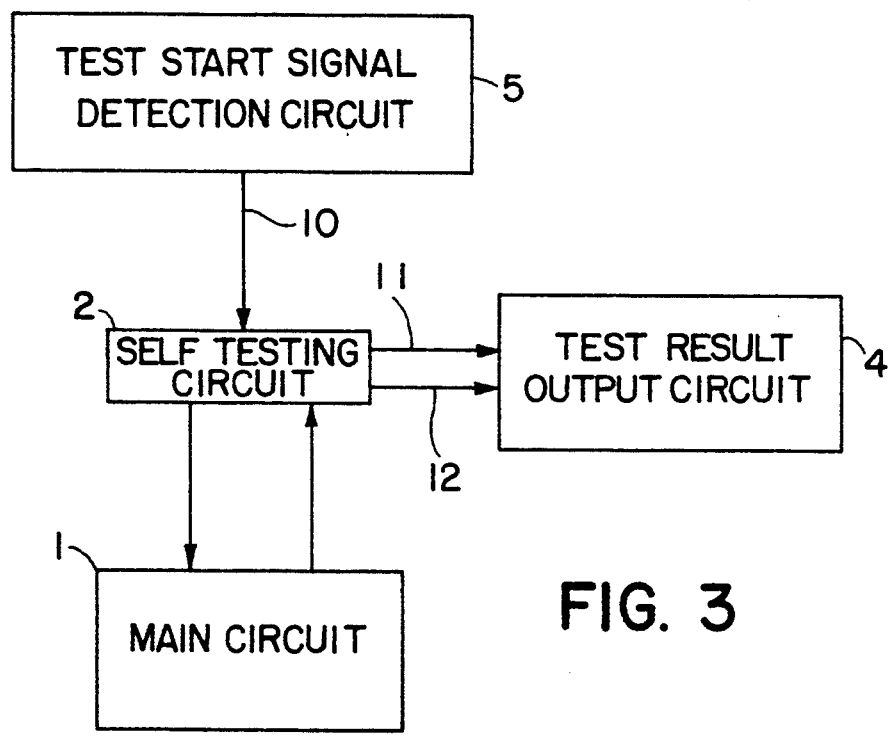
FIG. 3 is a block diagram showing a construction of a second embodiment of a semiconductor integrated circuit according to the invention.

FIG. 3 is a block diagram showing the construction of a second embodiment of a semiconductor integrated circuit according to the invention. The semiconductor integrated circuit comprises: a main circuit 1 of the semiconductor integrated circuit having the intended functions as the semiconductor integrated circuit; a self testing circuit 2 for self testing the main circuit 1 of the semiconductor integrated circuit; a test start signal detection circuit 5 for activating the self testing circuit 2, said circuit 5 containing a light sensitive device 15; a test result output circuit 4 containing a light emitting device for converting a test complete signal indicating the completion of the test and a test result signal indicating the test result, both being supplied from the self testing circuit 2, into optical signals for outputting to an external device. The light emitting device 14 is not an essential part of this embodiment of the invention.

Figure 4:
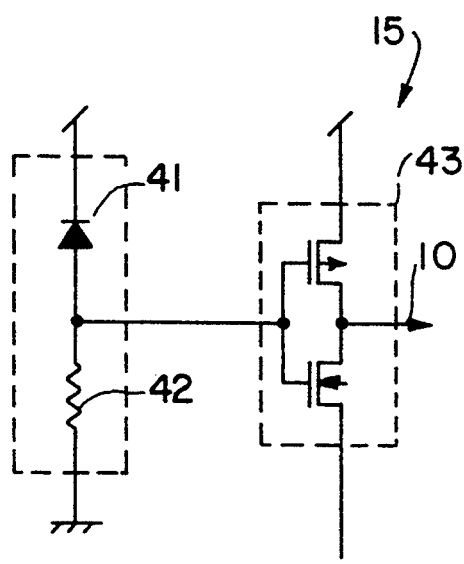
FIG. 4 shows a detailed circuit diagram of a light sensitive device in the second embodiment.

FIG. 4 shows a detailed circuit diagram of the light sensitive device 15 of this embodiment. The light sensitive device 15 comprises a light sensitive element 41 formed from a p-n junction diode, a high-resistance element 42 made from lightly doped polysilicon resistor, and a buffer (inverter) circuit 43 using MOSFETs.

The following describes the operation of the thus constructed semiconductor integrated circuit of the present embodiment. When external light for initiation of the self test is applied to part of the semiconductor integrated circuit including the light sensitive device 15 or to the entire surface of the semiconductor integrated circuit, the output of the light sensitive element 41, which has up to that time been dropped to the ground (negative) through the high-resistance element 42 because of no current flow under reverse bias conditions, will now go high (positive) because the light radiation causes a current to flow through the light sensitive element 41. The light sensitivity can be set as desired by appropriately determining the intensity of light radiation, the area size of the p-n junction, the resistance value of the high-resistance element 42, etc. The output is inverted and amplified through the buffer circuit 43 and then delivered as a test start signal 10 to the self testing circuit 2. The light radiation for activating the self testing circuit 2 may be stopped once the self testing circuit 2 has been activated. No adverse effects are caused to the circuit operation. Thereafter, the operation of the semiconductor integrated circuit proceeds in the same manner as described in the first embodiment.

As described, according to the present embodiment, since the light sensitive device 15 is provided which receives a signal instructing the initiation of the self test in the form of externally applied light, the external test start signal can be applied to the semiconductor integrated circuit without having to provide electrical connections. This permits the simultaneous testing of the semiconductor integrated circuits on the same substrate as there is no need to provide electrical connections using a prober or the like which have previously prevented the simultaneous testing. Furthermore, since the light emitting device 14 is provided, the same effects as achieved in the first embodiment can also be obtained.

An example of the required number of probes in this embodiment is shown in FIG. 10. The number of simultaneously formed semiconductor integrated circuits is the same as in the first embodiment. As compared with the first embodiment, since the light sensitive device 15 is provided, a further elimination of 128 probes (test start signal pin TE) is achieved, which means a reduction by 256 probes as compared with the prior art example. The light emitting device 14 used in this embodiment, which is the same as used in the first embodiment, is not an essential part to accomplish the present embodiment. With the addition of the light sensitive device 15 only, 128 probes (TE) can be rendered unnecessary as compared with the prior art example.

Furthermore, since the light sensitive device 15 does not use any special device but is formed from a p-n junction diode that can be formed simultaneously with other devices in the usual process, no additional step is needed for the formation of the light sensitive device. Also, by providing two or more such light sensitive devices having light sensitive elements of different light sensitivities with varying junction area sizes and varying resistance values of the high-resistance element and by combining these devices with a number of logic circuits, it is possible to select and carry out the desired test function from among a plurality of self testing functions including the test start signal.

In the present embodiment, a p-n junction diode is used as the light sensitive device 15, but alternatively, a bipolar transistor, a thin oxide film used as a gate insulating film or a capacitor, etc. may be used.

Figure 5:
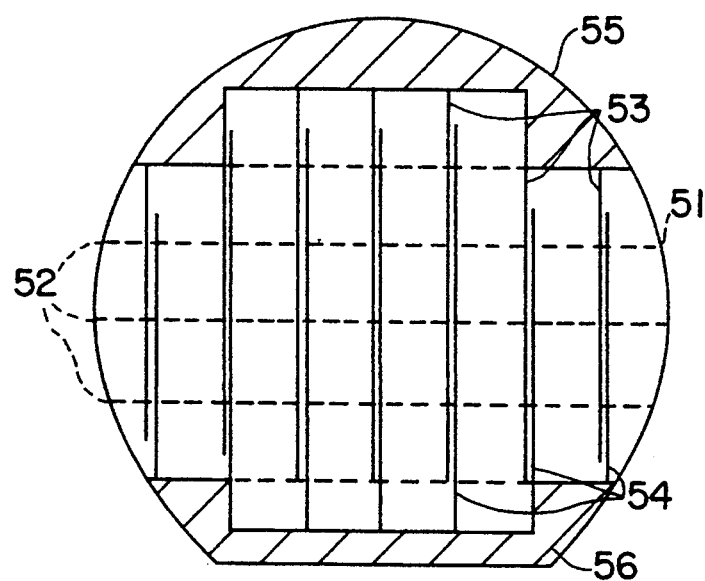
FIG. 5 shows a top plan view of a third embodiment of semiconductor integrated circuits according to the present invention.

FIG. 5 schematically shows a top plan view of a third embodiment of semiconductor integrated circuits according to the invention. A plurality of semiconductor integrated circuits 51 are formed on the same substrate (wafer), all having the same function and structure. Each semiconductor integrated circuit 51 has the same construction as shown in FIG. 3. The substrate has regions known as scribe lines (scribe lanes) 52 along which the individual semiconductor integrated circuits 51 are to be cut off. On the scribe lines, there are conductive wirings (conductive lines) 53 connecting each individual semiconductor integrated circuit 51 to the ground, and conductive wirings (conductive lines) 54 connecting each individuall semiconductor integrated circuit 51 to the power supply. An electrode (pad) 55 for external connections of the ground and an electrode (pad) 56 for external connections of the power supply are formed on the substrate.

Figure 6:
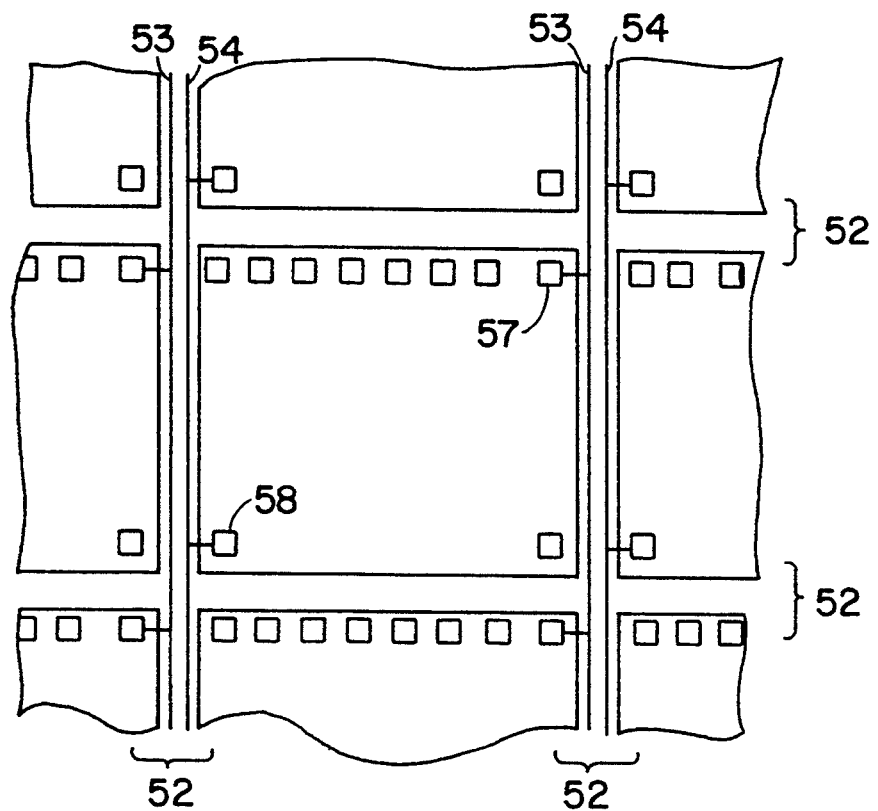
FIG. 6 shows an enlarged view of a portion of the substrate shown in FIG. 5.

FIG. 6 is an enlarged view of a portion of the substrate shown in FIG. 5 and shows one of the semiconductor integrated circuits and its adjacent areas. A ground electrode 57 is provided within each of the semiconductor integrated circuits 51 and connected to one of the ground wirings 53 formed on the scribe lines 52. A power supply electrode 58 is provided within each of the semiconductor integrated circuits 51 and connected to one of the power supply wirings 54 formed on the scribe lines 52.

In the thus constructed semiconductor integrated circuit of the embodiment, with the power supply externally connected to the electrodes 55 and 56, the supply voltage can be applied simultaneously to all the semiconductor integrated circuits formed on the same substrate. This permits the simultaneous testing of the plurality of semiconductor integrated circuits 51 on the same substrate as there is no need to provide electrical connections to individual semiconductor integrated circuits 51 using a prober or the like which have previously prevented the simultaneous testing. Also, the conductive wirings 53 and 54 interconnecting the semiconductor integrated circuits 51 are cut off when the individual semiconductor integrated circuits 51 are separated, and therefore do not cause any adverse effects to the semiconductor integrated circuits 51 after they have been separated. Furthermore, since the semiconductor integrated circuit 51 contains a light emitting device 14 and a light sensitive device 15, the effects according to the first and second embodiments, i.e. the elimination of the test start pins and test result output pins, can be achieved.

An example of the required number of probes in this embodiment is shown in FIG. 10. The number of simultaneously formed semiconductor integrated circuits is the same as in the first embodiment. As compared with the second embodiment, since the power supply wirings are provided common to the semiconductor integrated circuits, a further reduction of 254 probes is achieved, and with only two power supply wirings, all the semiconductor integrated circuits on the same wafer can be tested simultaneously, using the respective built-in self testing circuits, the test results being also output simultaneously, thus achieving a dramatic reduction in the test time. The light emitting device 14 and the light sensitive device 15 used in the present embodiment, which are the same ones as used in the first embodiment and the second embodiment, respectively, are not essential parts to accomplish the present embodiment. With the provision of the common power supply lines alone, a total of 254 probes can be rendered unnecessary.

In the present embodiment, the power supply wirings are taken for example as the electrodes for common connection, but it will be appreciated that other electrodes having the same function, such as the test start signal wirings, can also be connected in common. It should also be noted that the ground can be provided from the back surface of the semiconductor substrats.

Figure 7:
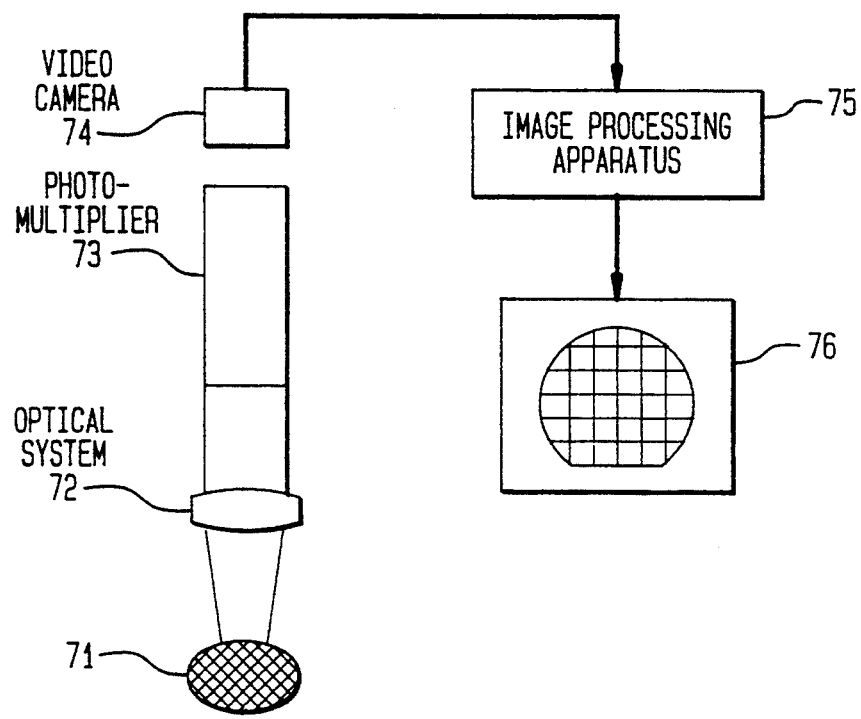
FIG. 7 shows a test fixture arrangement explaining a method of testing semiconductor integrated circuits according to the present invention.
Figure 8:
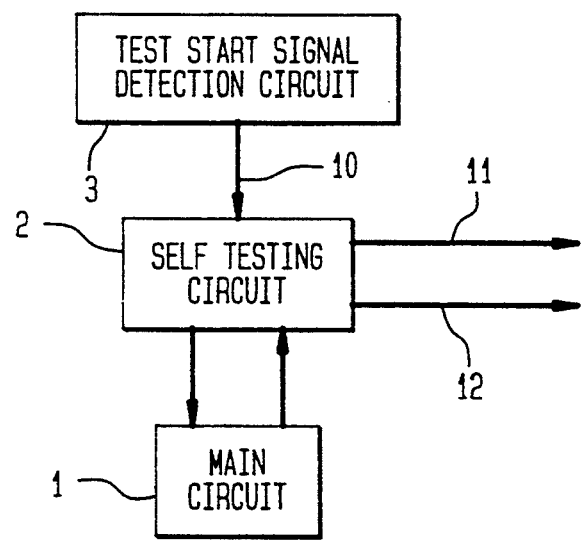
FIG. 8 is a block diagram showing a construction of a prior art example of a semiconductor integrated circuit with a built-in self testing circuit.

FIG. 7 shows a test fixture arrangement explaining a method of testing semiconductor integrated circuits according to a fourth embodiment of the present invention.

According to this embodiment, it is possible to read the test result of each semiconductor integrated circuit formed on a semiconductor substrate 71, the internal self testing result being output from the semiconductor integrated circuit in the form of very weak light generated by the light emitting device (not shown in FIG. 7), as described in conjunction with the first embodiment, formed from a MOSFET, p-n junction diode, bipolar transistor, thin insulating film, etc. The light emitted from the semiconductor integrated circuits formed on the semiconductor substrate 71 is passed through an optical system 72 and focused onto a photomultiplier 73. In the photomultiplier 73, the very weak light (photons) is first converted into electrons by means of a photoelectric plate. Then, by means of multi-channel plates, the electrons are multiplied to a detectable quantity and converted back into light which is received by a video camera 74. If the light received by the camera 74 is still weak or the signal-to-noise ratio is not adequate, an image processing apparatus 75 performs integrating image processing to display an image on a display 76.

The image processing apparatus 75 also processes the image taken therein as the test result information of each individual semiconductor integrated circuit. These pieces of information are transferred to subsequent steps for further detailed tests, such as, a final inspection step using testers, the step of marking defective chips, packaging step, etc.

As described, according to the embodiment, even if the light emitted from the light emitting device of the test result output circuit is very weak, the light can be detected for production of test result information. Therefore, no special considerations are needed as to the supply voltage, channel length, drain geometry, etc. of the light emitting MOSFET such as described in the first embodiment, and the light emitting device can be constructed with the same MOSFET as used in the main circuit of the semiconductor integrated circuit. Also, since these pieces of information are processed together as two-dimensional information by the image processing apparatus, respectively corresponding one-to-one to the plurality of semiconductor integrated circuits simultaneously formed on the same substrate, the results can be obtained quickly and without having to move the light sensitive device or the stage that supports the semiconductor substrate.

As described above, according to the present invention, by applying a test start signal in non-contacting manner for activating the self testing circuit, by receiving a test complete signal and a test result signal also in non-contacting manner from an external device, and by applying power simultaneously to all integrated circuits on the same substrate, the semiconductor integrated circuits formed on the same substrate can be tested all at the same time, using their respective self testing circuits, thereby accomplishing a dramatic reduction in the test time and offering a great advantage in practical applications.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patent-

What is claimed is:

1. A method of testing a semiconductor integrated circuit comprising a main circuit, a self testing circuit for testing at least one part of functions of said main circuit, and a test result output circuit having at least one light emitting device for outputting test results from said self testing circuit in the form of light, said method comprising the steps of:

inputting a test start signal to said self testing circuit so as to initiate operation of said self testing circuit;

detecting light emitted from said light emitting device with an optical system, said light being emitted based on said test results from said self testing circuit; and obtaining said test results based on said light detection.

2. A method of testing a plurality of semiconductor integrated circuits formed on a substrate, each of said plurality of semiconductor integrated circuits comprising a main circuit, a self testing circuit for testing at least one part of functions of said main circuit, and a test result output circuit having at least one light emitting device for outputting test results from said self testing circuit in the form of light in a two-dimensional distribution, said method comprising the steps of:

inputting a test start signal to said self testing circuit so as to initiate operation of said self testing circuit;

detecting a two-dimensional distribution of light emitted from a plurality of said light emitting devices with an optical system, said light being emitted based on said test results from said self testing circuit; and obtaining a two-dimensional map of said test results by an image processing technique, based on said two-dimensional distribution of said light.

3. The method of claim 1, wherein said optical system includes a photomultiplier.

4. The method of claim 2, wherein said optical system includes a photomultiplier that produces electric signals representative of a two-dimensional image of said two-dimensional distribution of said light, and a two-dimensional map of said test results is obtained based on said electric signals.

* * * * *

UNITED STATES PATENT AND TRADEMARK OFFICE
CERTIFICATE OF CORRECTION

PATENT NO.    : 5,355,081
DATED         : October 11, 1994
INVENTOR(S)   : Nakata et al.

It is certified that error appears in the above-identified patent and that said Letters Patent is hereby corrected as shown below:

COVER PAGE [57] Abstract, line 7, after the word "start" insert --signal--.

Signed and Sealed this

Twenty-first Day of February, 1995

Attest:

BRUCE LEHMAN

*Attesting Officer*    *Commissioner of Patents and Trademarks*